(12) United States Patent
Yuan-Chi

(10) Patent No.: US 7,639,028 B2
(45) Date of Patent: Dec. 29, 2009

(54) PROBE CARD ASSEMBLY WITH ZIF CONNECTORS

(75) Inventor: Lin Yuan-Chi, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 0 days.

(21) Appl. No.: 11/889,398

(22) Filed: Aug. 13, 2007

(65) Prior Publication Data

US 2008/0290884 A1 Nov. 27, 2008

(30) Foreign Application Priority Data

May 25, 2007 (TW) .............................. 96118661 A

(51) Int. Cl.
*G01R 31/02* (2006.01)
(52) U.S. Cl. ...................... 324/754; 324/757
(58) Field of Classification Search ......... 324/754–765; 439/59–260, 264–265, 325
See application file for complete search history.

(56) References Cited

U.S. PATENT DOCUMENTS

| | | | | |
|---|---|---|---|---|
| 3,552,257 A | * | 1/1971 | Tanabe ....................... 411/368 |
| 3,950,058 A | * | 4/1976 | Cronin ......................... 439/51 |
| 4,176,900 A | * | 12/1979 | Hines et al. ................. 439/260 |
| 4,500,836 A | * | 2/1985 | Staudacher ................ 324/73.1 |
| 5,747,994 A | * | 5/1998 | Suga ........................ 324/158.1 |
| 5,777,485 A | * | 7/1998 | Tanaka et al. ............... 324/757 |
| 5,936,416 A | * | 8/1999 | Tanaka et al. ............... 324/754 |
| 6,184,698 B1 | * | 2/2001 | Yoshida et al. ............. 324/755 |
| 6,398,570 B1 | * | 6/2002 | Yoshida et al. ............. 439/259 |
| 6,478,596 B2 | * | 11/2002 | Yoshida et al. ............. 439/259 |
| 7,339,385 B2 | * | 3/2008 | Takasu et al. ............... 324/754 |
| 2002/0132501 A1 | * | 9/2002 | Eldridge et al. .............. 439/66 |
| 2006/0273809 A1 | * | 12/2006 | Miller et al. ................ 324/754 |

FOREIGN PATENT DOCUMENTS

TW 475984 10/1999

* cited by examiner

*Primary Examiner*—Ha Tran T Nguyen
*Assistant Examiner*—Richard Isla Rodas
(74) *Attorney, Agent, or Firm*—Ming Chow; Sinorica, LLC

(57) ABSTRACT

This invention discloses a probe card assembly with adjustable ZIF connectors. The probe card assembly comprises a substrate, a plurality of ZIF connectors and a plurality of adjustable fastening means for assembling and disassembling the ZIF connectors on the substrate. The substrate is a disclike plate, having a first surface, a second surface, a plurality of concave sections disposed on the second surface and a plurality of first through holes perpendicular to the first surface. The first through holes are circularly arranged toward the substrate center. Pairs of first contacts are provided on the first surface adjacent to both sides of first through holes. A plurality of terminals are protruded from the second surface of the substrate for contacting and testing the wafer. The ZIF connectors are also circularly arranged toward the substrate center. Each ZIF connector has parallelly arranged second through holes from the top to the bottom of the connector and pairs of contact terminals for contacting the first contacts of the substrate. The adjustable fastening means are disposed from the concave section through the first and second through holes to assembling and disassembling the ZIF connectors on the first surface of the substrate.

6 Claims, 11 Drawing Sheets

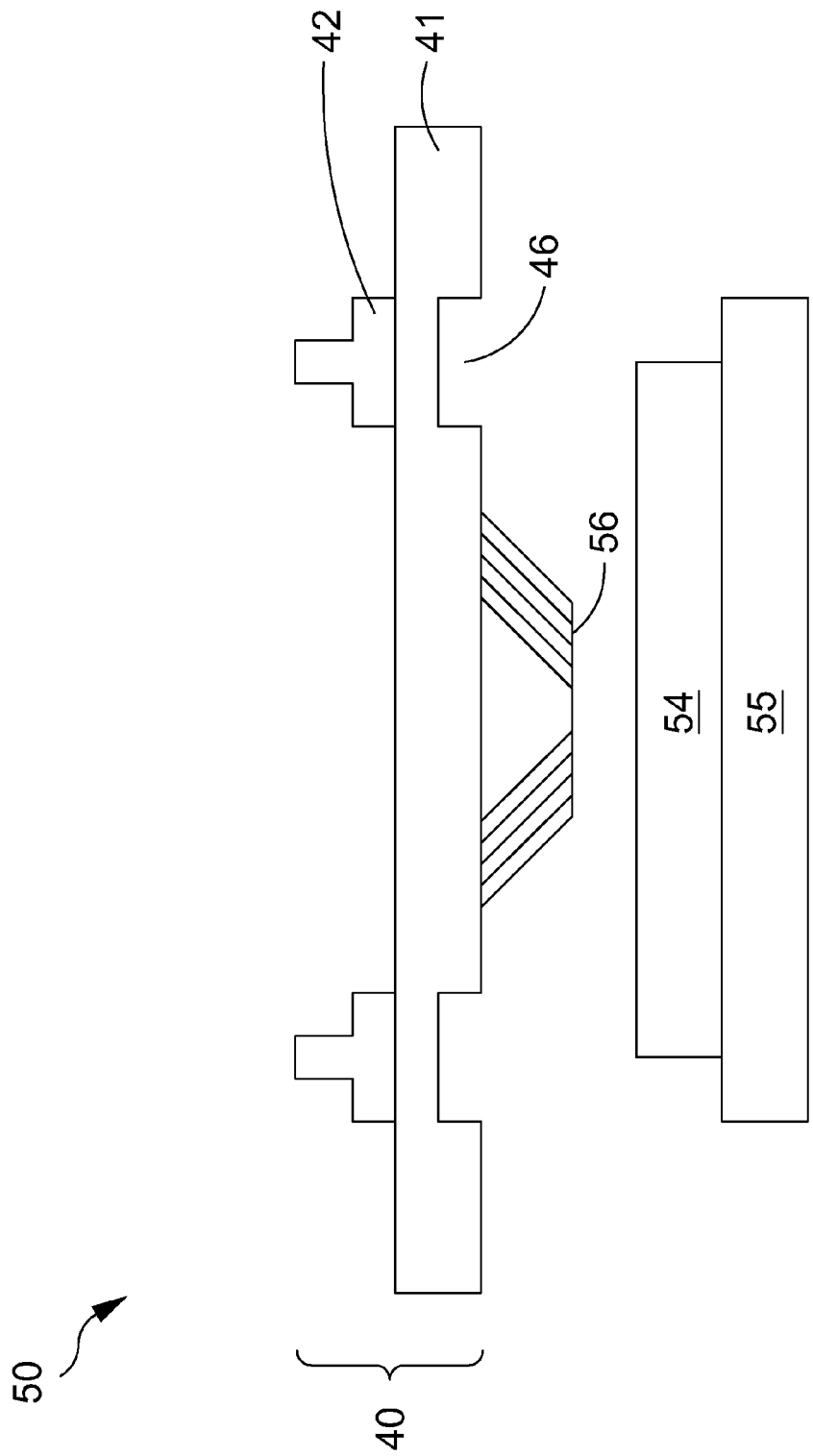

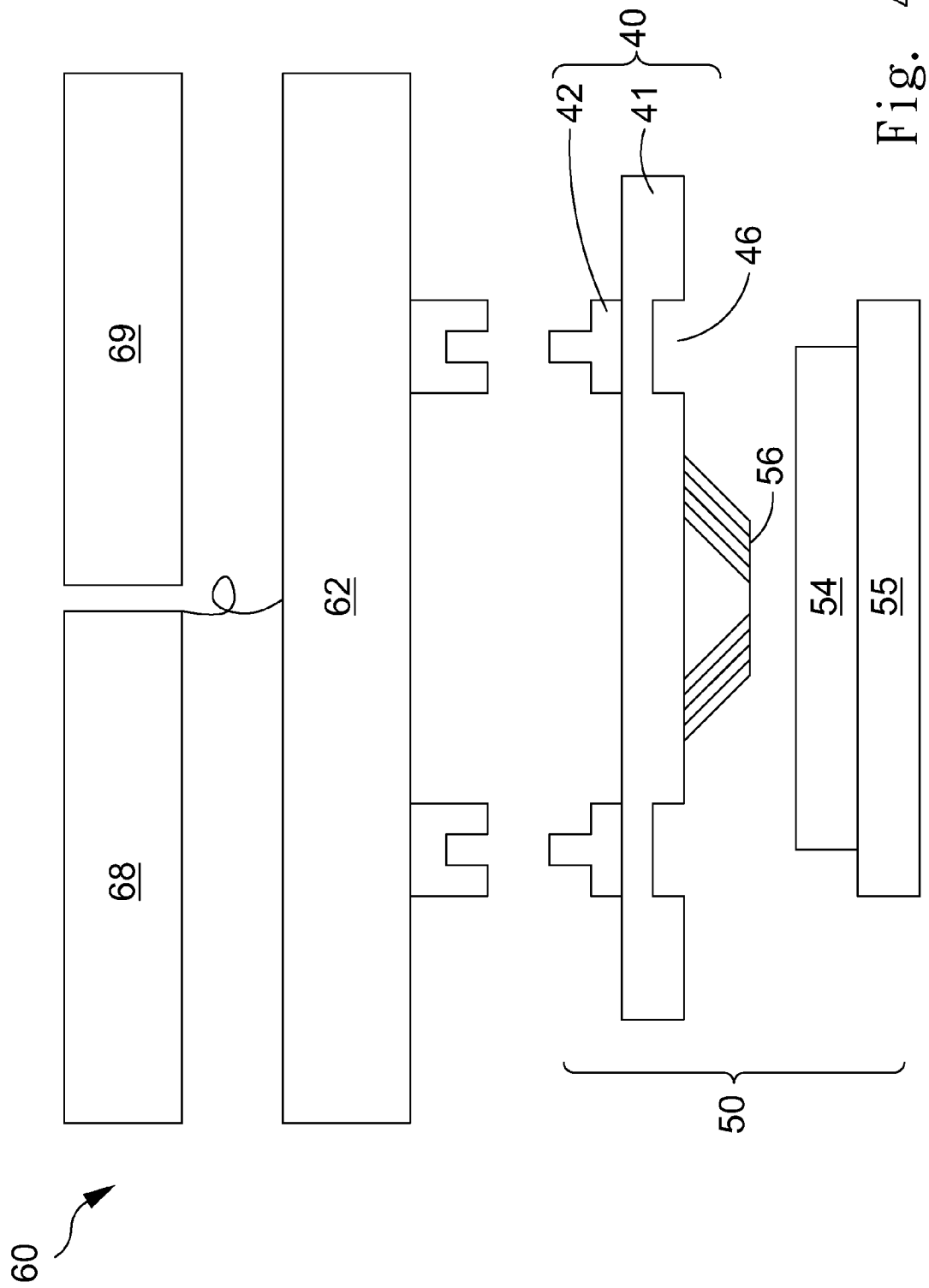

PROBE CARD ASSEMBLY WITH ZIF CONNECTORS

FIELD OF THE INVENTION

The present invention relates to a probe card and a testing system used in a wafer test, and more particularly, to a structure of a probe card with ZIF connectors and an assembling method introduced by the same.

BACKGROUND OF THE INVENTION

In wafer fabrication, a probe card with high performance is required to perform a wafer test prior to the wafer saw so as to test the quality of dies on the wafer, as disclosed in the prior art such as U.S. Pat. No. 6,292,005 as well as Taiwan patent No. TW460703. A precise contacting apparatus is located on the probe card to make contact with the wafer under test, conduct circuits, and perform electric test.

Refer to FIG. 1A. A schematic view of a wafer test system is illustrated. A control system 10 emits a test signal and passes it to a tester 12 as known by those skilled in the art. A motherboard 15 and a ZIF (Zero Insertion Force) female plug connector 17 are equipped on the tester 12. The ZIF female plug connector 17 is to be connected with the ZIF connector 18 so as to transmit the test signal to the probe card 19. U.S. Pat. Nos. 6,184,698, 6,398,570, 6,478,596 as well as Taiwan Patent No. TW475984 have disclosed a method for connecting the ZIF female plug connector 17 with the ZIF connector 18. The probe card 19 is provided with probe pins 20 on its bottom for electrically connecting the ZIF connectors 18. A prober loads the wafer under test 21 onto the moving table 22 so that the wafer 21 can be contacted with the probe pins 20 on the bottom of the probe card 19 via the movement of the moving table 22 to perform the test as well as to send the test signal back to the control system 10.

Refer to FIG. 1B. A conventional connection mode of the ZIF connector 18 and the probe card 19 is shown. A rivet 201 directly passes through the ZIF connector 18 and the probe card 19, and thus the ZIF connector 18 is riveted on the upper surface of the probe card 19. A plurality of golden fingers 202 are disposed on each of two sides of the ZIF connectors 18 so as to transmit signals to the ZIF female plug connector 17. In addition, the golden fingers 202 are extended under the ZIF connector 18 and extended outwardly to form a radial shape so as to make contact with pads on the probe card 19 (not shown) for receiving signals. In the conventional rivet-connection mode, the swaging force needs to be precisely controlled in strength and direction when swaging the rivet 201. As a result, a certain gap A and a certain predetermined force can be maintained after all the golden fingers 202 have the contact with the pad on the probe card 19, thereby the impedance match can be fixed to obtain the stable test signals. During the wafer testing process, the ZIF connectors 18 must be capable of sustaining the repeatedly plugged and unplugged operations from the female plug connector 17. After a while, the golden fingers 202 will be worn out, and it will change both the gap A and the predetermined force to cause bad connections between the pad portion of the probe card 19 and the golden fingers 202, thereby the test result will be affected. Then, the probe card will have to be replaced for maintenance.

Refer to FIG. 1C. A schematic view of another conventional ZIF connector structure from U.S. Pat. No. 6,642,729 is shown. Fixed pins (i.e. rivets) 1251 and 1253 are disposed under the ZIF connectors so that the ZIF connectors can be connected to the probe card and affixed thereon.

Refer to FIG. 1D. A top view of the ZIF connector 18 affixed on the probe card 19 is shown. In this example, there are sixty four ZIF connectors 18 affixed on the probe card 19. It is to be noted that when the probe card 19 proceeds to the wafer test, if the abnormality occurs in the gap or the predetermined force between some golden finger of the ZIF connectors 18 and the probe card 19, the whole probe card 19 has to be removed from the testing system. The ZIF connector 18 needs to be replaced and the gap A and the predetermined force need to be re-adjusted. During the steps of replacing the ZIF connector 18, a rivet head needs to be peeled off by using a sharp knife so that the rivet can be removed; however, if force is carelessly applied, the ZIF connector 18 can be easily damaged, or worse, the probe card 19 can be damaged. The structure of the probe card 19 is very complex. General speaking, the probe card 19 is of multiple layers, usually more than twelve layers. The pitch between the pads thereon is very small and needs to be reworked at a semiconductor level so that the price is extremely expensive. The cost becomes very high due to replacing the whole probe card 19, when damage is caused by adjusting or detaching a ZIF connector 18. Therefore, what is urgently needed is to provide a simple and effective approach to connecting, replacing and adjusting the ZIF connector and the probe card.

SUMMARY OF THE INVENTION

In order to solve the above mentioned problems, the present invention provides a wafer testing system, a wafer prober, and a structure of a probe card with a plurality of concave sections used therein. The probe card is equipped with replaceable and detachably adjustable ZIF connectors. The probe card structure includes a substrate means, a plurality of concave sections disposed on the second surface, a plurality of ZIF connectors, and a plurality of detachably adjustable fastening means. The substrate is a disc-like plate, having a plurality of first through holes perpendicular to the first surface and the concave sections. The first through holes are circularly arranged toward the substrate center. Besides, the ZIF connectors are also circularly arranged on the first surface of the substrate means toward the substrate means center. Each ZIF connector has parallelly arranged second through-holes from the top to the bottom of the ZIF connector. The plurality of detachably adjustable fastening means are disposed from the concave section through the first and second through holes to assembling and disassembling the ZIF connectors on the first surface of the substrate.

Therefore, the object of the present invention is to provide a probe card structure with the ZIF connectors by a novel connection mode of the concave sections of the probe card and the ZIF connectors, whereby it is easy to maintain or replace damaged ZIF connectors located on the probe card.

Another object of the present invention is to provide a probe card structure with the ZIF connectors that may appropriately adjust the contact force between the golden fingers of the ZIF connectors and the pads on the probe card by a novel connection mode of the concave sections of the probe card and the ZIF connectors so as to obtain stable test signals.

Yet another object of the present invention is to provide an assembling method for the probe card with the ZIF connectors by a novel connection mode of the concave sections of the probe card and the ZIF connectors so that the ZIF connectors can be installed on the probe card in an easier manner.

Yet another object of the present invention is to provide an assembling method for the probe card with the ZIF connectors by a novel connection mode of the concave sections of the probe card and the ZIF connectors so as to adjust the contact force between the ZIF connectors and the probe card.

Yet another object of the present invention is to provide a wafer prober having the probe card structure with the ZIF connectors. The structure has a novel connection mode of the concave sections of the probe card and the ZIF connectors that the damaged ZIF connector on the probe card can be easily repaired or replaced, and the contact force between the ZIF connector and the probe card can be adjusted at the same time.

Yet another object of the present invention is to provide a wafer testing system. The probe card structure used in the wafer testing system has a novel connection mode for the ZIF connector so that the damaged ZIF connector on the probe card can be easily repaired or replaced, and the contact force between the ZIF connector and the probe card can be adjusted at the same time.

Yet another object of the present invention is to provide a wafer testing method. The probe card structure used in the wafer testing method has a novel connection mode for the ZIF connector so that the damaged ZIF connector on the probe card can be easily repaired or replaced, and the contact force between the ZIF connector and the probe card can be adjusted at the same time.

BRIEF DESCRIPTION OF THE DRAWINGS

FIG. 3 is a schematic view of a wafer prober equipped with a probe card having concave sections in accordance with the second embodiment of the present invention;

FIG. 4 is a schematic view of a wafer testing system equipped with a probe card having concave sections in accordance with the third embodiment of the present invention;

DETAILED DESCRIPTION OF THE PREFERRED EMBODIMENTS

Since the present invention discloses a wafer testing system used in semiconductor back-end processing, wherein the basic principles of the semiconductor manufacturing are well-known by those skilled in the art, the following description will omit the description of the principles. Moreover, the diagrams included in the following are not completely drawn according to the real size and are only used to demonstrate features related to the present invention.

Figure 1A:
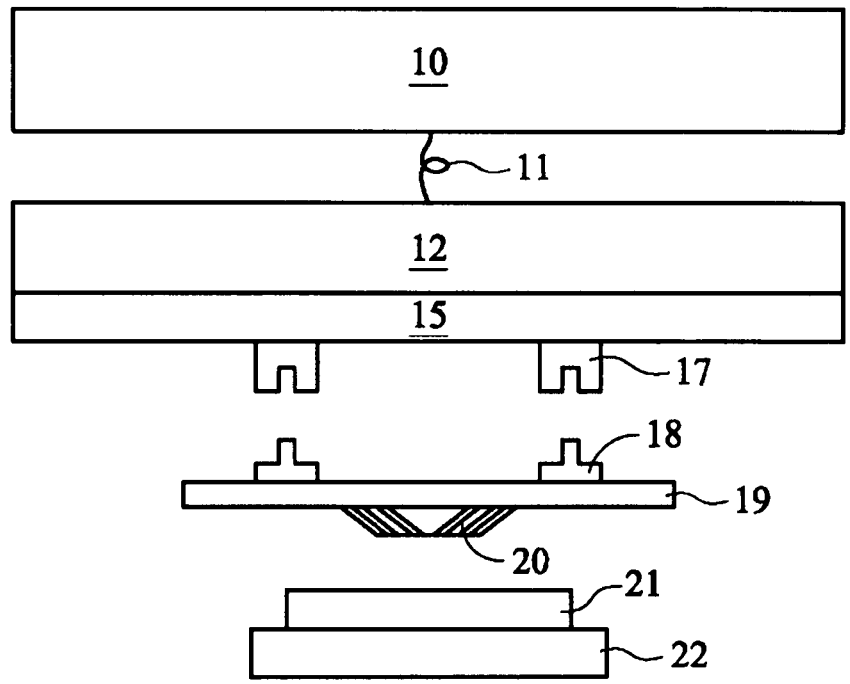
FIG. 1A is a schematic view of a conventional wafer testing system.
Figure 1B:
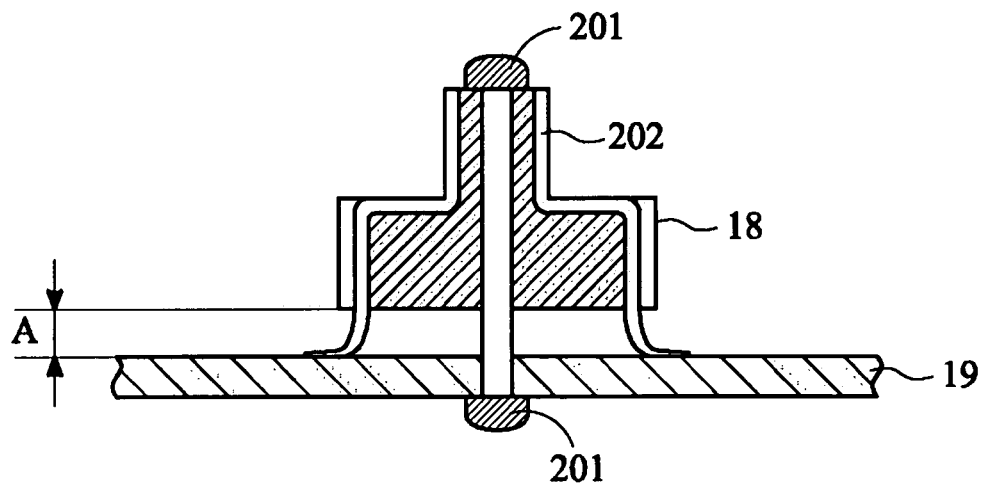
FIG. 1B is a cross-sectional view of a conventional connection mode for a ZIF connector and a probe card.
Figure 1C:
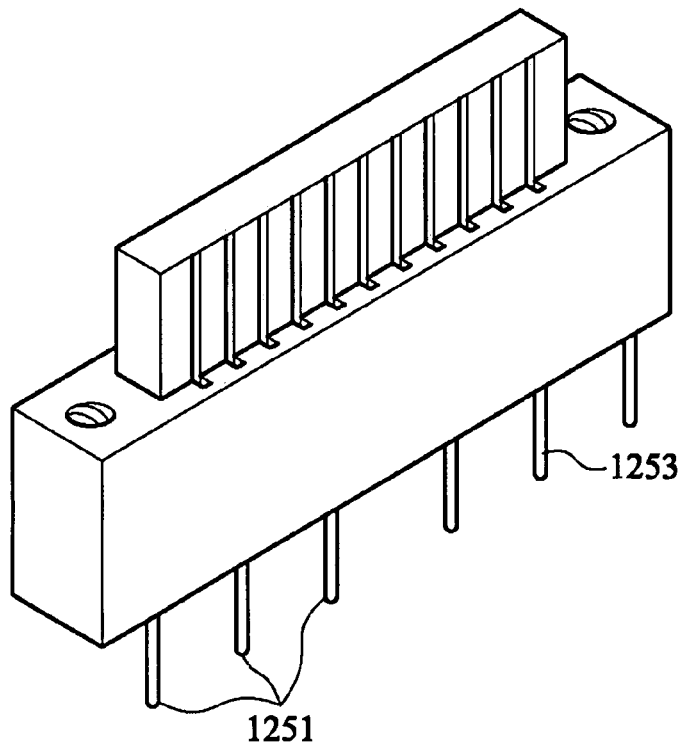
FIG. 1C is a three-dimensional view of a conventional ZIF connector and a fixed pin.
Figure 1D:
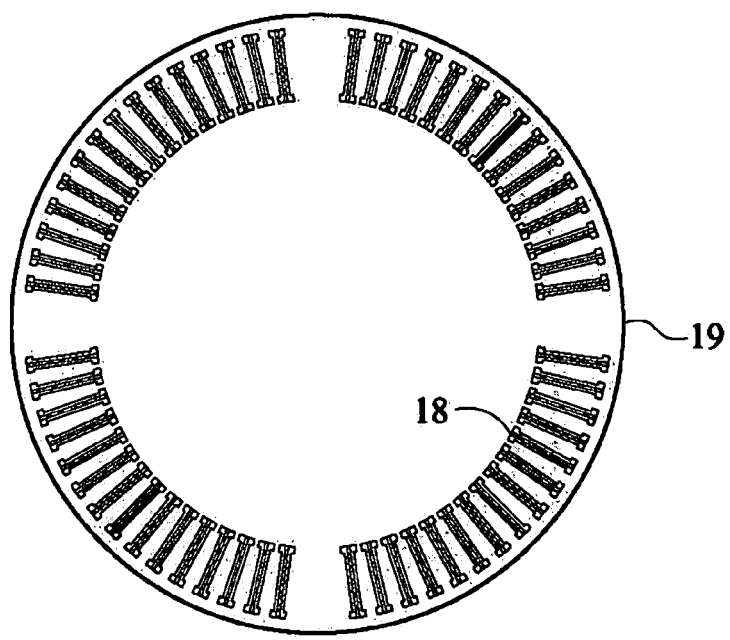
FIG. 1D is a top view of a conventional probe card having a plurality of ZIF connectors provided on the surface thereof.
Figure 2A:
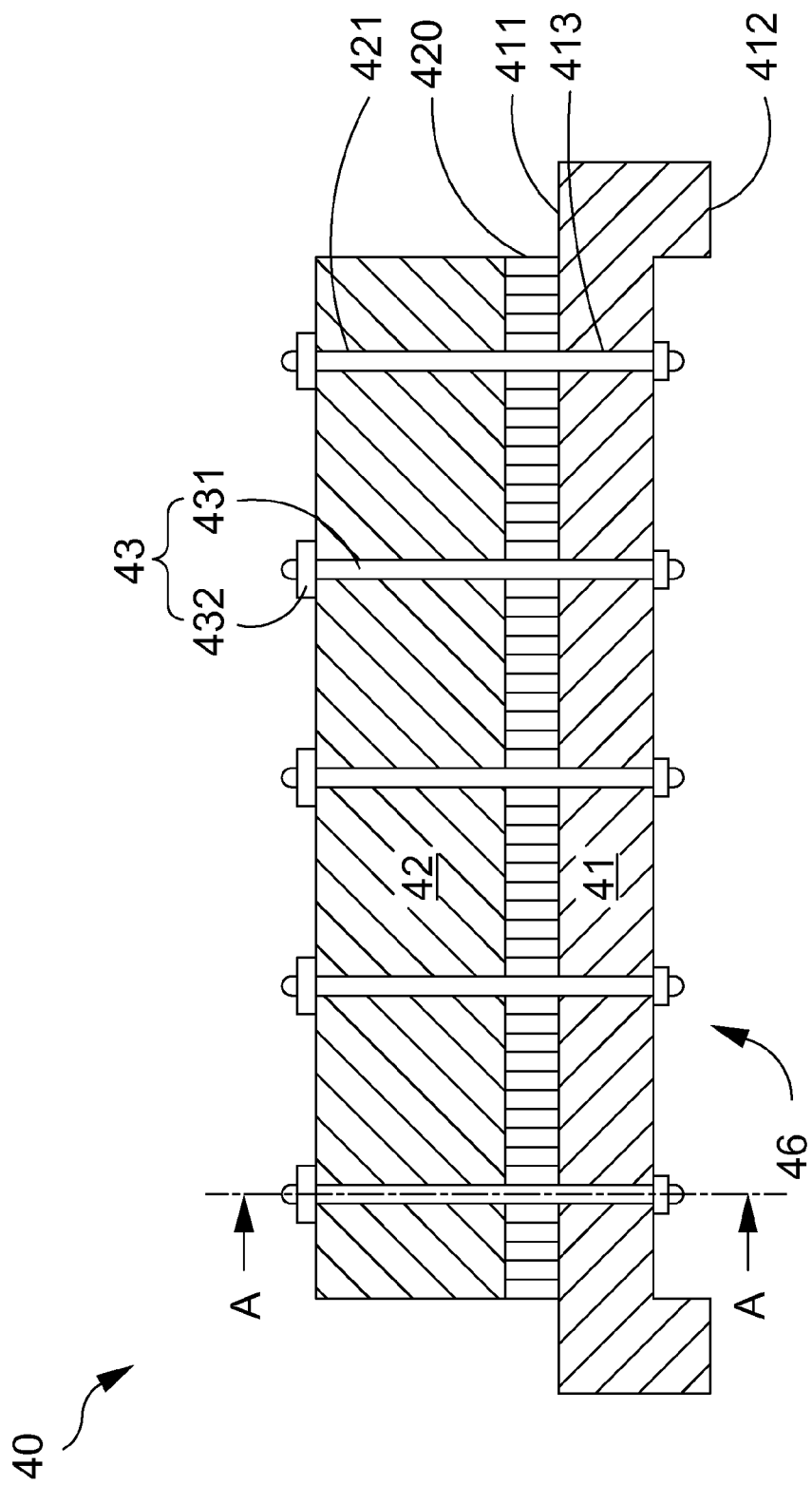
FIG. 2A is a cross-sectional view of a probe card equipped with ZIF connectors having electric terminals in accordance with the first embodiment of the present invention.

Refer to FIG. 2A. A probe card with ZIF connectors is shown in accordance with the first preferable embodiment of the present invention. The probe card 40 comprises a substrate means 41, a plurality of ZIF connectors 42 and a plurality of adjustable fastening means 43. The substrate means 41 is a disc-like plate (shown in FIGS. 2F-2G), having a first surface 411, a second surface 412 and a plurality of first through-holes 413 perpendicular to the first surface 411 and the second surface 412 of the substrate means 41. The first through-holes 413 are circularly arranged toward the substrate means 41 center. Pairs of first electric contacts (not shown) are provided on the first surface 411 adjacent to both sides of first through-holes 413. A plurality of electric terminals (not shown) are protruded from the second surface 412 of the substrate means 41 for contacting and testing the wafer. The plurality of ZIF connectors 42 are toward the center of the substrate means 41 and circularly arranged on the first surface 411 of the substrate means 41, and each of the ZIF connector 42 has a plurality of parallelly arranged second through-holes 412 from the top to the bottom of the ZIF connector 42 and pairs of electric terminals 420 are extended through the bottom of each ZIF connector 42 for contacting the first electric contacts (not shown) of the first surface 411 of the substrate means 41 in such a space between the bottom of ZIF connector 42 and the first surface 411 of the substrate means 41. The plurality of adjustable fastening means 43 are disposed through the first through-holes 413 (indicated at the edge of bolt 431 through substrate means 41) and second through-holes 421 (indicated at the edge of bolt 431 through ZIF connectors 42) to affix the ZIF connectors 42 on the first surface 411 of the substrate means 41.

Figure 2B:
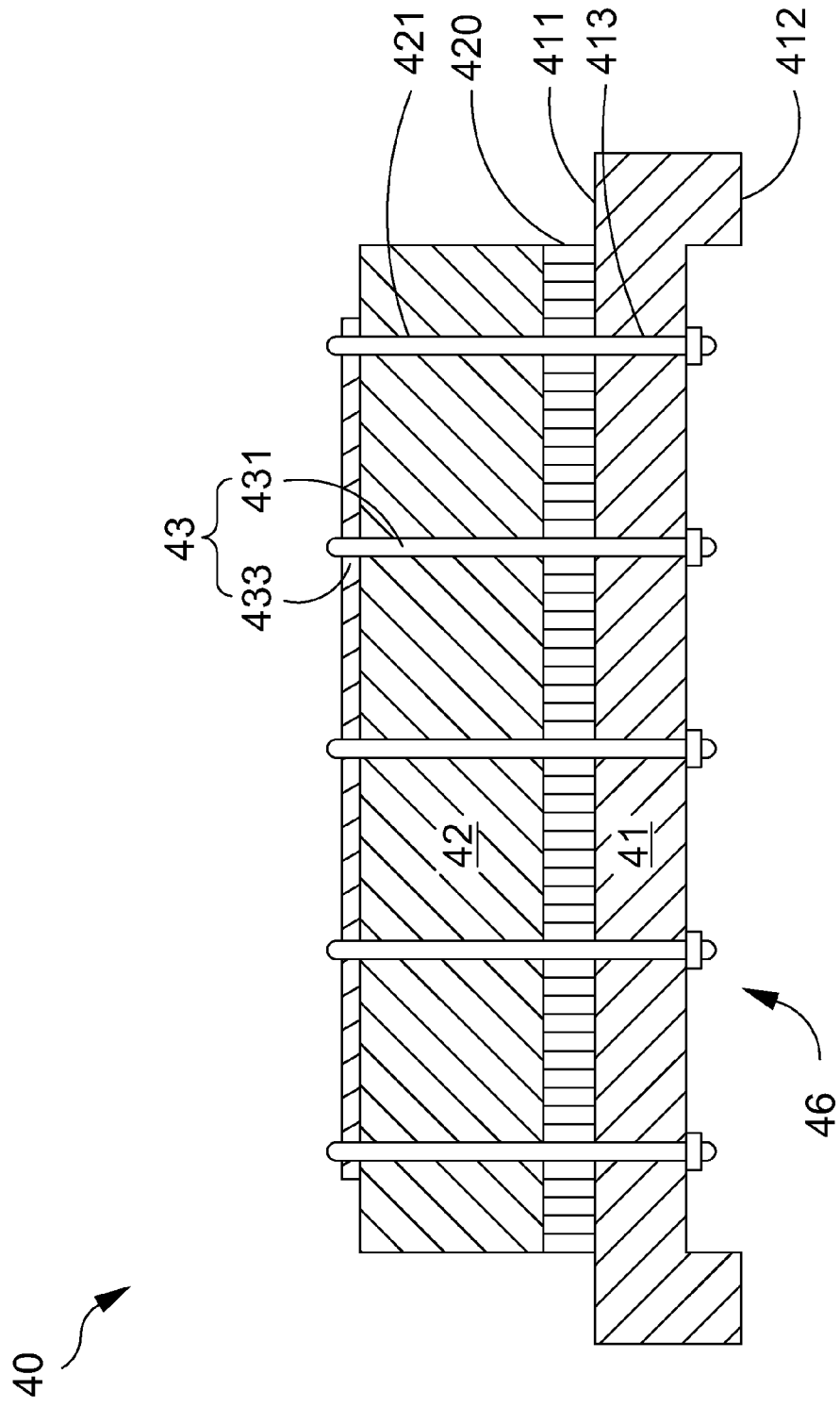
FIG. 2B is a cross-sectional view of the probe card equipped with the ZIF connectors having electric terminals together with a fastening plate in accordance with the first embodiment of the present invention.
Figure 2C:
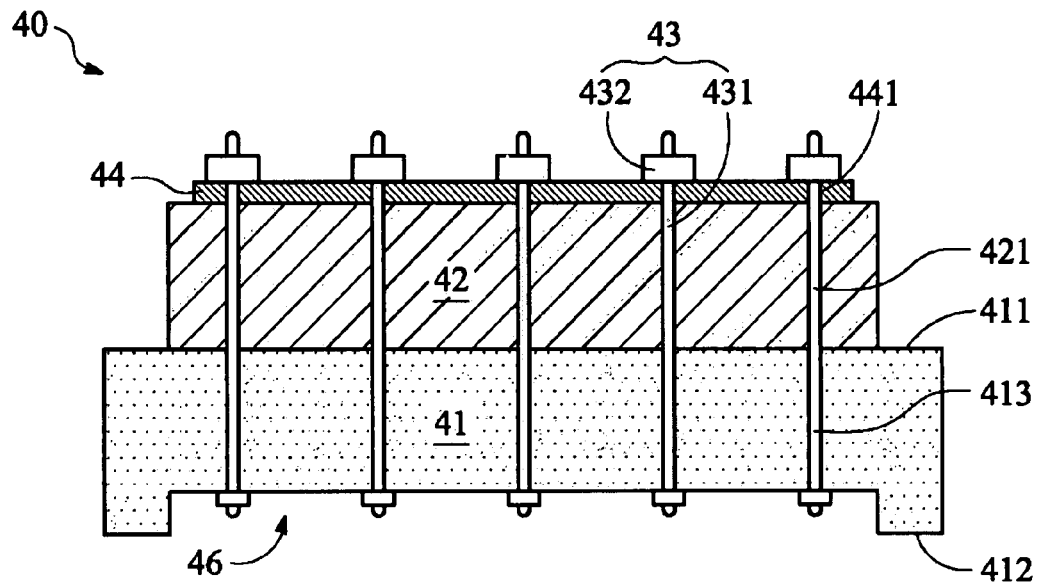
FIG. 2C is a cross-sectional view of the probe card equipped with the ZIF connectors having electric terminals together with a depressor in accordance with the first embodiment of the present invention.
Figure 2D:
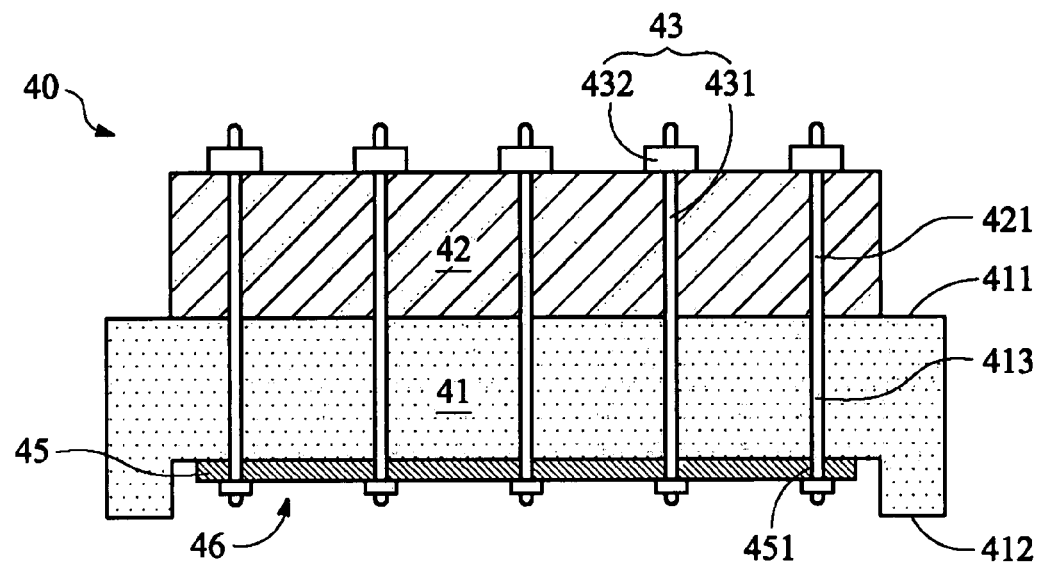
FIG. 2D is a cross-sectional view of the probe card equipped with the ZIF connectors having electric terminals together with a second depressor in accordance with the first embodiment of the present invention.
Figure 2E:
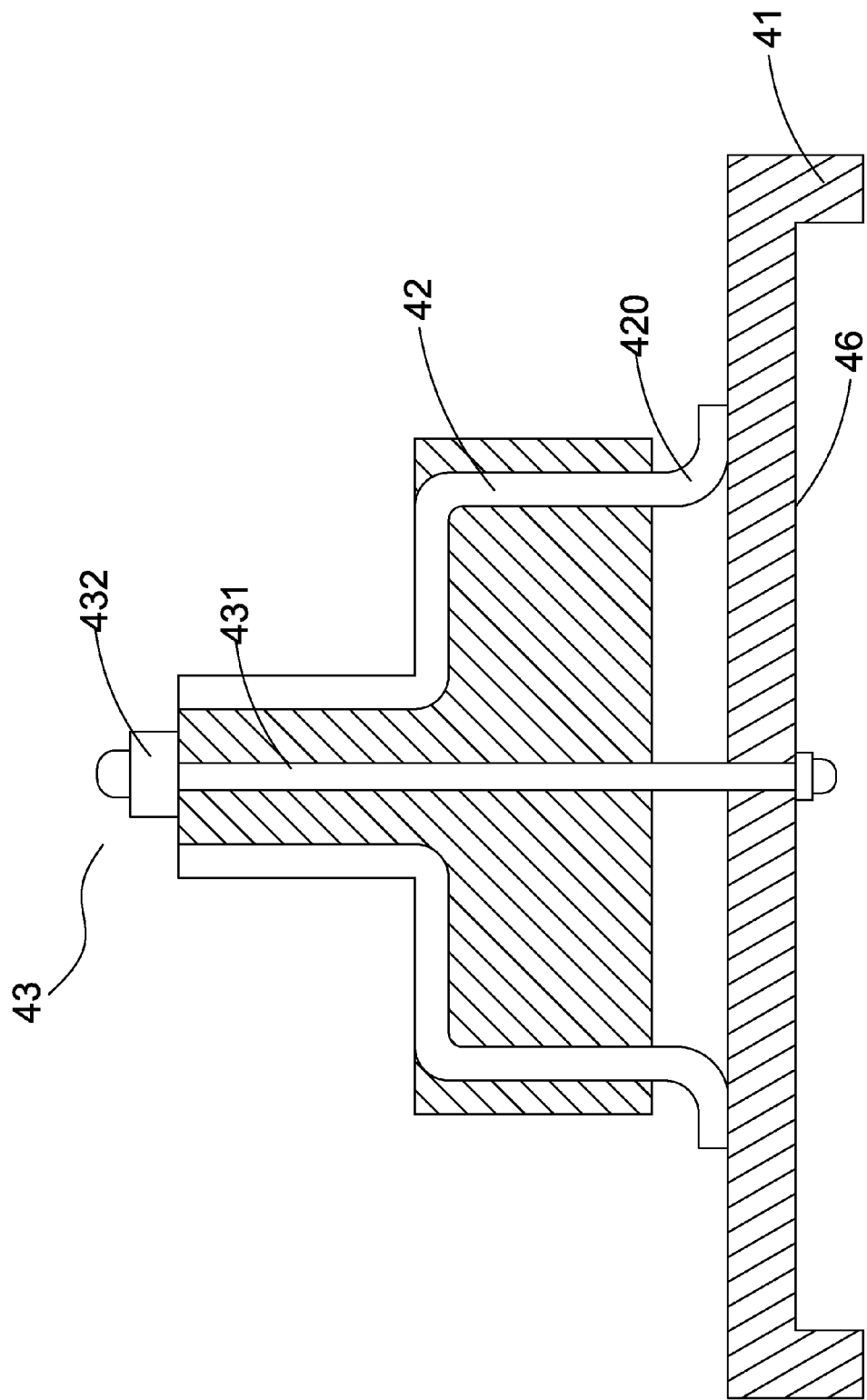
FIG. 2E is a cross-sectional view of the probe card taken along line A-A in FIG. 2A of the present invention.

Refer to FIG. 2E, the probe card 40 is further shown as a cross-sectional view taken along the line A-A (perpendicular to paper of the drawing) in FIG. 2A, so it can be seen that the pairs of electric terminals 420 of the ZIF connector 42 are extended to the space to contact with the first surface 411 of the substrate means 41 for signal transmission during wafer test. Besides, the adjustable fastening means 43 is provided through the middle of the ZIF connector 42 so that the adjustable fastening means 43 can adjust the contact force between the pairs of electric terminals 420 of the ZIF connector 42 and the substrate 41 of the probe card 40 for better signal transmission during wafer test. If some pairs of electric terminals of a ZIF connector have bad contact with the substrate of the probe card, the technician just either adjusts some adjustable fastening means corresponding to the "bad contact" pairs of electric terminals or replaces bad ZIF connector(s) for obtaining better contact force between the electric terminals of the ZIF connector and the substrate means, without replacing the whole probe card at price.

In the above mentioned embodiment, the fastening means 43 are detachably adjustable, such as a combination of a bolt 431 and a nut 432. For the sake of assembly, the bolt 431 may pass through the substrate means 41 and the ZIF connector 42 from the back end of the substrate means 41 to affix the nut 432 on the upside of the ZIF connector 42, as shown in FIG. 2A. Alternatively, the bolt 431 may pass through the ZIF connector 42 and the substrate means 41 from the front end of the ZIF connector 42 to affix the nut 432 on the downside of the ZIF connector 42 of the substrate means 41 (not shown). The number of the bolt 431 is not limited as long as the force to affix the ZIF connector 42 to the substrate means 41 is strong enough to make a stable connection.

A plurality of concave sections 46 are disposed on the second surface 412. The main purpose of the concave sections 46 is to provide a concave space under the substrate means 41 to accommodate the adjustable fastening means not only for saving space of the substrate means but also for preventing damages to the surface of wafer (not shown) because the adjustable fastening means 43 extending through the substrate means 41 may directly contact with the wafer to damage the wafer during assembling or disassembling the ZIF connectors 42 on the substrate means 41.

In the above mentioned embodiment, multiple nuts can be integrated into a fastening plate 433 provided with multiple holes, as shown in FIG. 2B. When assembled, the bolt 431 may pass through the substrate means 41 and the ZIF connector 42 from the downside of the substrate means 41 to affix the fastening plate 433 on the upside of the ZIF connector 42. Alternatively, the bolt 431 may pass through the ZIF connector 42 and the substrate means 41 from the upside of the ZIF connector 42 to affix the fastening plate 433 on the downside of the substrate means 41.

In the above mentioned embodiment, in order to enhance the fastening force to affix the ZIF connector 42 to the substrate means 41, the sealing get or resin may be further provided in the cross locking portions of the fastening means 43 to decrease the loosening possibility of the fastening means 43 for connecting the ZIF connector 42 with the substrate means 41.

In the above mentioned embodiment, the first depressor 44 may be further provided on the top surface of the ZIF connectors 42, as shown in FIG. 2C. The first depressor 44 is provided with the third through-holes 441 located on the opposite side of the second through-holes 421 so that the fastening means 43 can pass therethrough for being affixed thereon. The function of the first depressor 44 is to scatter the pressure directly applied on the ZIF connectors 42 from the fastening means 43 as well as to prevent the fastening means 43 from scratching the surface of the ZIF connector 42.

In the above mentioned embodiment, the second depressor 45 may be provided on the second surface 412 of the substrate means 41, as shown in FIG. 2D. The second depressor 45 is provided with the fourth through-holes 451 located on the opposite side of the first through-holes 413 of the substrate means 41 so that the fastening means 43 can pass therethrough for being affixed thereon. The function of the second depressor 45 is to scatter the pressure directly applied on the substrate means 41 from the fastening means 43 as well as to prevent the fastening means 43 from scratching the surface of the substrate means 41.

The above mentioned first depressor 44 and second depressor 45 may be provided separately or together. The fastening means 43 may be a combination of a bolt 431 and a nut 432, or a combination of a bolt 431 and a fastening plate 433. When assembled, a bolt 431 may pass through the substrate means 41 and the ZIF connectors 42 from the downside of the substrate means 41 for being affixed on the top of the ZIF connectors 42; alternatively, a bolt 431 may pass through the ZIF connectors 42 and the substrate means 41 from the upside of the ZIF connectors 42 for being affixed on the downside of the substrate means 41.

Figure 2F:
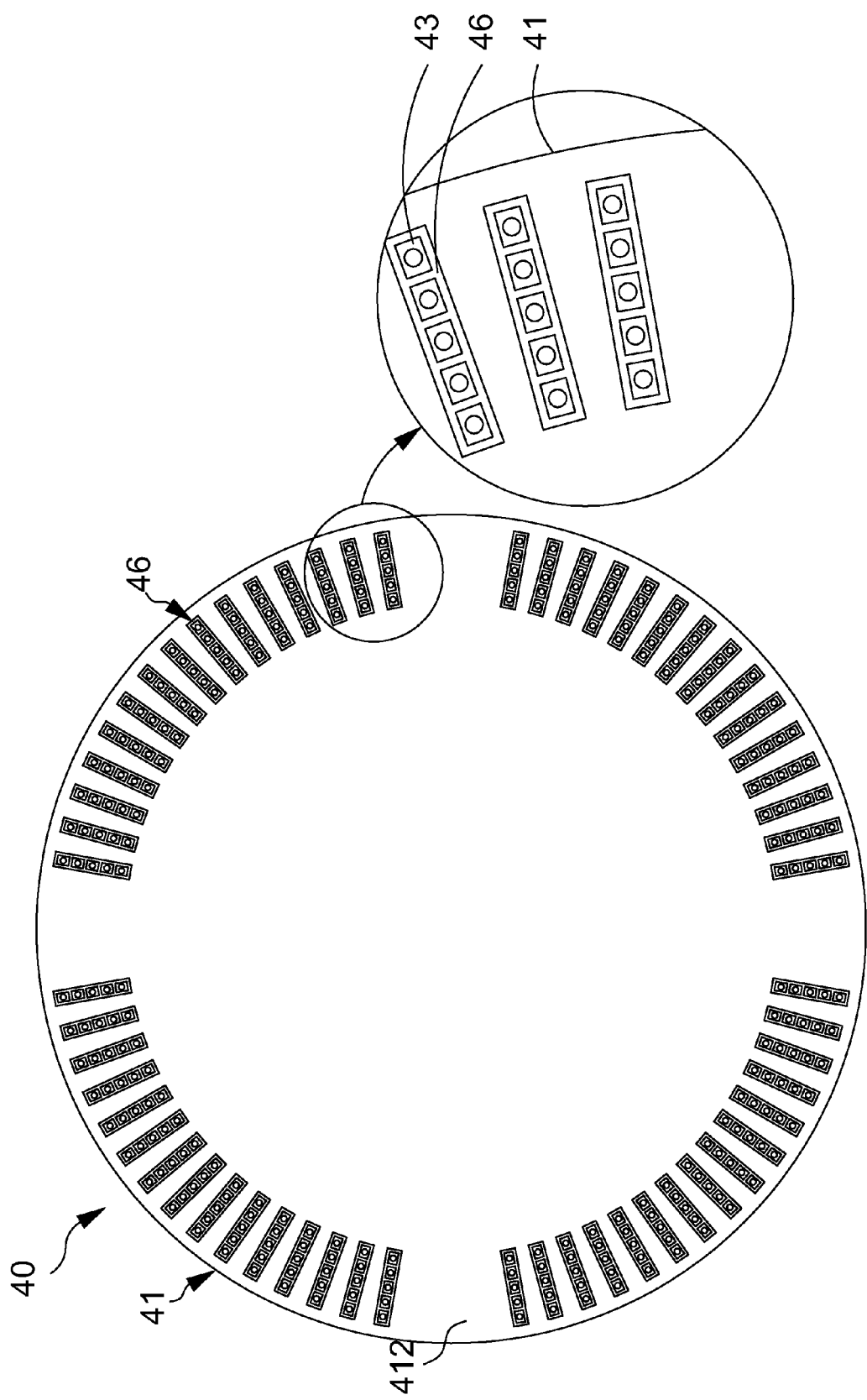
FIG. 2F is a bottom view of the probe card of a disk-like shape having a substrate means equipped with concave sections in accordance with FIGS. 2A-2C of the present invention.

Referring to FIG. 2F, taken from the bottom view of the probe card, it can be seen that probe card 40 has the substrate means 41 of generally disk-like shape, and the substrate means 41 has a plurality of concave sections 46 disposed on its second surface 412. Furthermore, from the partially enlarge view of the concave sections 46, it can be seen that every five pieces of fastening means 43 are disposed on each concave section 46, and each fastening means 43 has its bottom portion abutting on the concave section 46 in correspondence with FIGS. 2A-2C. Besides, it is obvious that each ZIF connector 42 is disposed on the first surface 411 opposite to the second surface 412 of the substrate means 41.

Figure 2G:
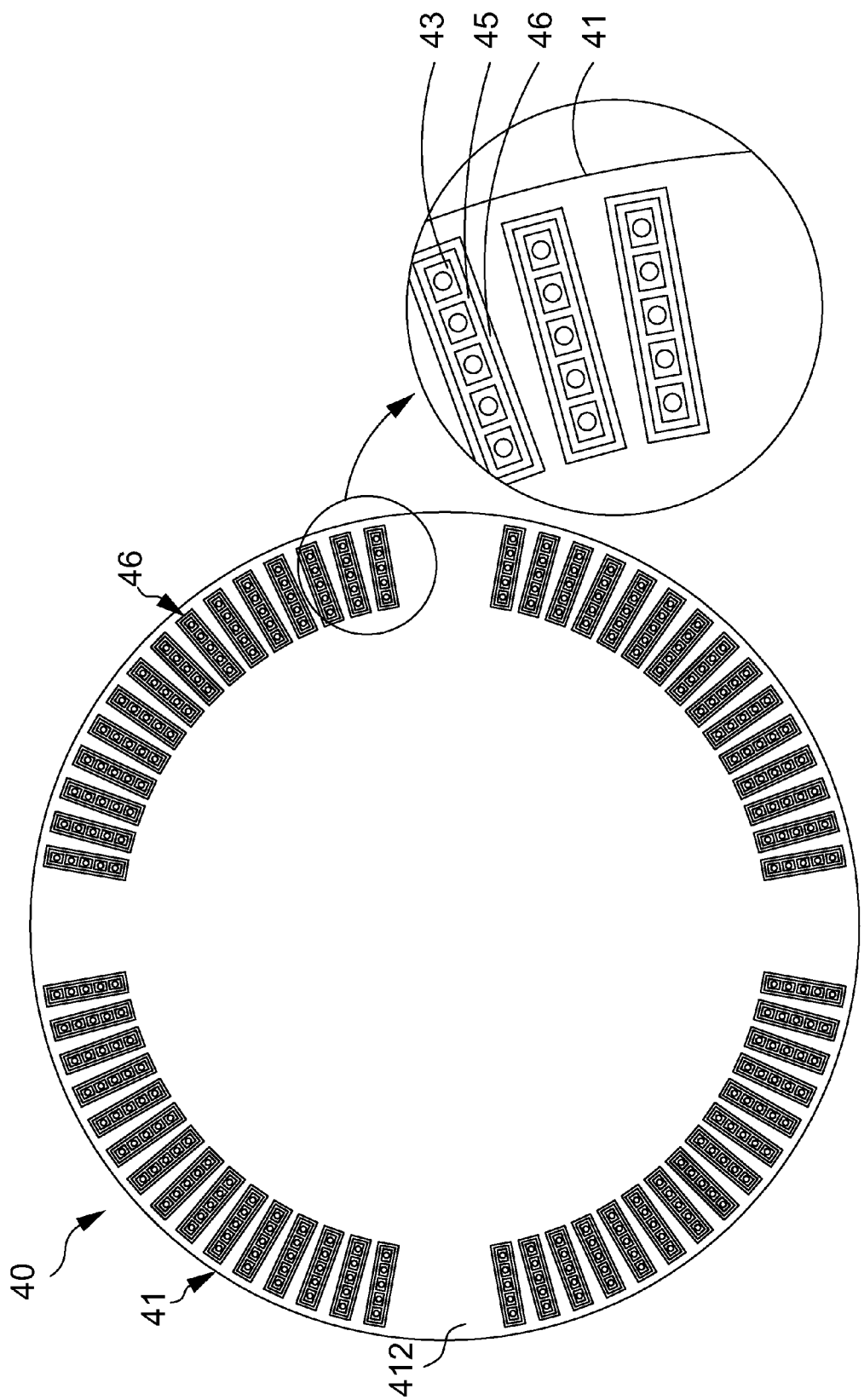
FIG. 2G is a bottom view of the probe card of a disk-like shape having a substrate means equipped with concave sections together with the second depressor in accordance with FIG. 2D of the present invention.

Referring to FIG. 2G, it is similar to FIG. 2F and the difference is that each second depressor 45 is disposed between the fastening means 43 and the concave section 46. Furthermore, from the partially enlarge view of the concave sections 46, it can be seen that every five pieces of fastening means 43 are disposed on each concave section 46, and each fastening means 43 has its bottom portion abutting on the second depressor 45 within the concave section 46 in correspondence with FIG. 2D.

Refer to FIG. 3. A wafer prober equipped with a probe card is shown in accordance with the second preferable embodiment of the present invention. The wafer prober 50 includes at least a probe card 40, and a moving table 55. Wherein, the moving table 55 is used to load a wafer under test 54 for moving along the X-Y-Z axial directions. The wafer under test 54 can make contact with the probe pins 56 under the probe card 40 through the movement of the moving table 55 so as to perform electrical tests. The probe card 40 is chucked by a probe card chuck (not shown). The technical features and relating structures of the probe card 40 are described in the first embodiment.

Refer to FIG. 3. A wafer prober equipped with a probe card is shown in accordance with the second preferable embodiment of the present invention. The wafer prober 50 includes at least a probe card 40, and a moving table 55. Wherein, the moving table 55 is used to load a wafer under test 54 for moving along the X-Y-Z axial directions. The wafer under test 54 can make contact with the probe pins 56 under the probe card 40 through the movement of the moving table 55 so as to perform electrical tests. The probe card 40 is chucked by a probe card chuck (not shown). The technical features and relating structures of the probe card 40 are described in the first embodiment. For example, the probe card 40 has a substrate means 41 equipped with a plurality of concave sections 46, and fastening means are omitted herein.

Refer to FIG. 4. A wafer testing system for a probe card is shown in accordance with the third preferable embodiment of the present invention. The wafer testing system 60 includes a wafer prober 50, a tester 62, a controlling and processing means 68, and a displaying means 69. The wafer prober 50 includes at least a probe card 40, and a moving table 55. Wherein, the moving table 55 is used to load a wafer under test 54 for moving along the X-Y-Z axial directions. The wafer under test 54 makes contact with the probe pins 56 under the probe card 40 through the movement of the moving table 55 so as to perform electrical tests. The test result is sent back to the tester 62 through the ZIF connector. After the calculation of the test result by the controlling and processing means 68, the calculated test result is displayed on the displaying means 69. The probe card 40 is chucked by a probe card chuck apparatus (not shown). The technical features and relating structures of the probe card 40 are described in the first embodiment.

Refer to FIG. 4. A wafer testing system for a probe card is shown in accordance with the third preferable embodiment of the present invention. The wafer testing system 60 includes a wafer prober 50, a tester 62, a controlling and processing means 68, and a displaying means 69. The wafer prober 50 includes at least a probe card 40, and a moving table 55. Wherein, the moving table 55 is used to load a wafer under test 54 for moving along the X-Y-Z axial directions. The wafer under test 54 makes contact with the probe pins 56 under the probe card 40 through the movement of the moving table 55 so as to perform electrical tests. The test result is sent back to the tester 62 through the ZIF connector. After the calculation of the test result by the controlling and processing means 68, the calculated test result is displayed on the displaying means 69. The probe card 40 is chucked by a probe card chuck apparatus (not shown). The technical features and relating structures of the probe card 40 are described in the first embodiment. For example, the probe card 40 has a substrate means 41 equipped with a plurality of concave sections 46, and fastening means are omitted herein.

Figure 5:
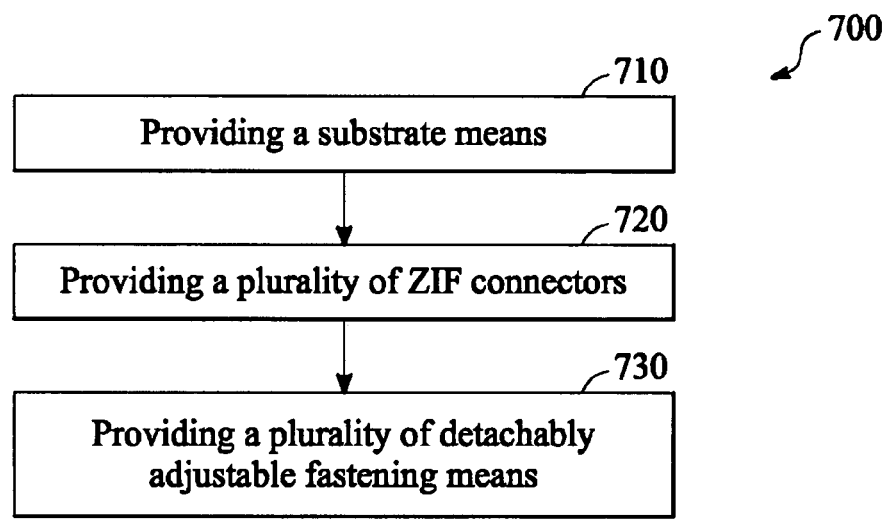
FIG. 5 is a flow chart showing an assembling method for a ZIF connector and a probe card in accordance with the fourth embodiment of the present invention.

Refer to FIG. 5. An assembling method for the ZIF connectors and the probe card is shown in accordance with the fourth preferable embodiment of the present invention. The assembling method includes the following steps:

(1) Provide a substrate means 41 (step 700), wherein the substrate means 41 is a disk-like shape and has a first surface 411, a second surface 412, and a plurality of first through-holes 413 perpendicular to the first surface 411 and the second surface 412 of the substrate means 41. The plurality of the first through-holes 413 are circularly arranged toward a center of the substrate means 41 and pairs of first electric contacts (not shown) being provided on the first surface 411 adjacent to both sides of the first through-holes 413. Moreover, a plurality of the probe pins (not shown) are protruded from the second surface 412 of the substrate means 41.

(2) Provide a plurality of ZIF connectors 42 (step 710), wherein the ZIF connectors 42 are toward the center of the substrate means 41 and circularly arranged on the first surface 411 of the substrate means 41, and each of the plurality of ZIF connectors 42 has a plurality of parallel second through-holes 412 from the top to the bottom of the ZIF connectors 42 and pairs of electric terminals (not shown) are deposed on the bottom of each ZIF connector 42 for contacting the first electric contacts (not shown) of the substrate means 41.

(3) Provide a plurality of detachable and adjustable fastening means 43 (step 720), passing through the first through-holes 413 and the second through-holes 421 so as to affix the ZIF connectors 42 on the first surface 411 of the substrate means 41.

In the assembling method of the above mentioned embodiment, the fastening means 43 is detachably adjustable and it is a combination of a bolt 431 and a nut 432. For the sake of assembly, the bolt 431 may pass through the substrate means 41 and the ZIF connector 42 under the substrate means 41 to affix the nut 432 on top of the ZIF connector 42, as shown in FIG. 2A. Alternatively, the bolt 431 may pass through the ZIF connector 42 and the substrate means 41 from the upside of the ZIF connector 42 so as to affix the nut 432 on the downside of the substrate means 41 (not shown). The number of the bolt 431 is not limited as long as the force to affix the ZIF connector 42 to the substrate means 41 is strong enough to make a stable connection.

In the above mentioned embodiment, multiple nuts can be integrated into a fastening plate 433 provided with multiple holes, as shown in FIG. 2B. When assembled, the bolt 431 may pass through the substrate means 41 and the ZIF connector 42 under the substrate means 41 so as to affix the fastening plate 433 on the upside of the ZIF connector 42. Alternatively, the bolt 431 may pass through the ZIF connector 42 and the substrate means 41 from the upside of the ZIF connector 42 so as to affix the fastening plate 433 on the downside of the substrate means 41.

In the above mentioned embodiment, in order to enhance the fastening force to affix the ZIF connector 42 to the substrate means 41, the seating gel or resin may be further provided in the cross locking portions of the fastening means 43 to decrease the loosening possibility of the fastening means 43 for connecting the ZIF connector 42 with the substrate means 41.

In the above mentioned embodiment, the first depressor 44 may be further provided on the top surface of the ZIF connectors 42, as shown in FIG. 2C. The first depressor 44 is provided with the third through-holes 441 located on the opposite side of the second through-holes 421 so that the fastening means 43 can pass therethrough for being affixed thereon. The function of the first depressor 44 is to scatter the pressure directly applied on the ZIF connectors 42 from the fastening means 43 as well as to prevent the fastening means 43 from scratching the surface of the ZIF connector 42.

In the above mentioned embodiment, the second depressor 45 may be provided on the second surface 412 of the substrate means 41, as shown in FIG. 2D. The second depressor 45 is provided with the fourth through-holes 451 located on the opposite side of the first through-holes 413 of the substrate means 41 so that the fastening means 43 can pass therethrough for being affixed thereon. The function of the second depressor 45 is to scatter the pressure directly applied on the substrate means 41 from the fastening means 43 as well as to prevent the fastening means 43 from scratching the surface of the substrate means 41.

The above mentioned first depressor 44 and second depressor 45 may be provided separately or together. The fastening means 43 may be a combination of a bolt 431 and a nut 432, or a combination of a bolt 431 and a fastening plate 433. When assembled, a bolt 431 may pass through the substrate means 41 and the ZIF connectors 42 from the downside of the substrate means 41 for being affixed on the top of the ZIF connectors 42; alternatively, a bolt 431 may pass through the ZIF connectors 42 and the substrate means 41 from the upside of the ZIF connectors 42 for being affixed on the downside of the substrate means 41.

Figure 6:
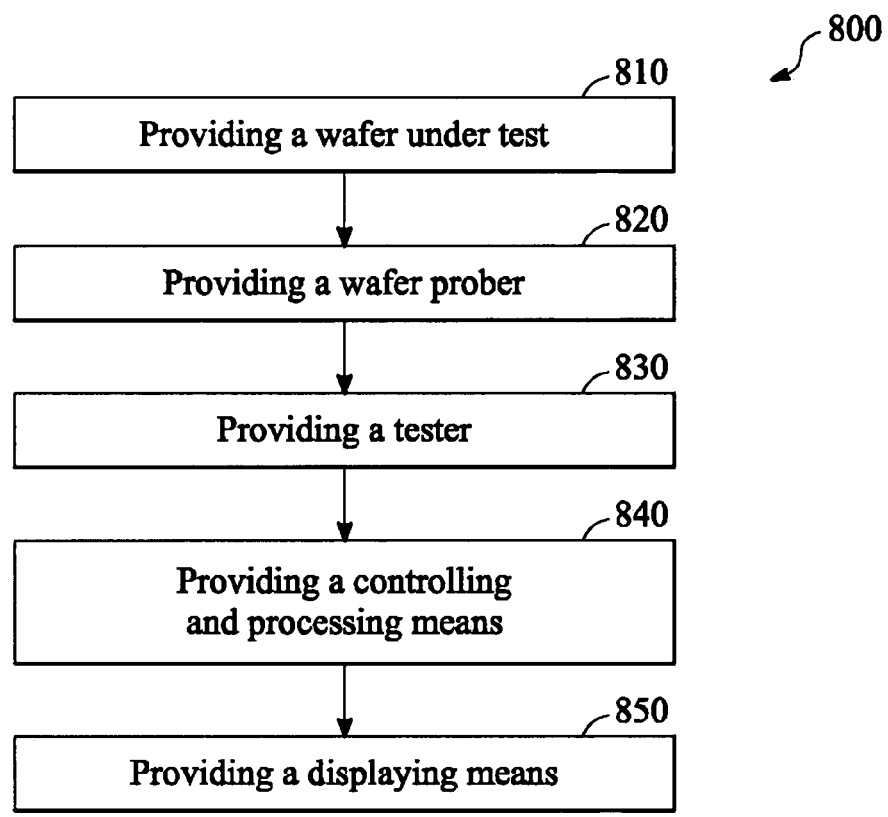
FIG. 6 is a flow chart showing a wafer testing method in accordance with the fifth embodiment of the present invention.

Refer to FIG. 6. A wafer testing method is illustrated in accordance with the fifth preferable embodiment of the present invention. The wafer testing method includes the following steps:

Step 810 is to provide a wafer under test 54.

Step 820 is to provide a wafer prober 50 so as to load the wafer under test 54 for preparing to perform the wafer test. The wafer prober 50 includes at least a probe card 40, a moving table 55, and a probe card chuck (not shown). The probe card 40 is chucked on the above mentioned probe card chuck. The moving table 55 is used to load the wafer under test 54 for moving along X-Y-Z axes. The wafer under test 54 makes contact with the probe pins 56 on the downside of the probe card 40 through the movement of the moving table 55 so as to perform the electrical tests. Wherein, the technical features and relating structures of the probe card 40 are described in the first preferable embodiment.

Step 830 is to provide a tester 62. The tester 62 has a ZIF female plug connector so as to correspondingly connect to the plurality of ZIF connectors of the substrate means. The tester 62 emits signals to the wafer prober 50 and receives the test signals sent back from the wafer prober 50.

Step 840 is to provide a controlling and processing means 68 that calculates the test signals sent from the tester 62 so as to obtain the test result of the wafer under test 54.

Step 850 is to provide a displaying means 69 that outputs the test result calculated by the controlling and processing means 68.

The above mentioned preferred embodiments of the present invention are not meant to limit the scope of the present invention. The description of the present invention should be understood by those skilled in the art. Moreover, any changes or modifications or the equivalent thereof that can be made without departing from spirit of the present invention should be protected by the following claims.

What is claimed is:

1. A probe card with ZIF connectors, comprising:
   a substrate means, having a first surface, a second surface, a plurality of concave sections disposed on the second surface and a plurality of first through-holes perpendicular to said first surface and said concave sections, said plurality of first through-holes being circularly arranged toward a center of said substrate means;
   a plurality of ZIF connectors being circularly arranged on said first surface of said substrate means toward said center of said substrate means, each of said plurality of ZIF connectors having parallelly arranged second through-holes from the top to the bottom of said ZIF connectors and pairs of electric terminals being deposed on the bottom of each ZIF connector for contacting first electric contacts of said substrate means; and
   a plurality of detachably adjustable fastening means being disposed through said first through-holes and said second through-holes for assembling and disassembling said ZIF connectors on said first surface of said substrate means, said plurality of detachably adjustable fastening means comprise a combination of bolts and nuts; and
   a plurality of depressors deposed on the top surface of the ZIF connectors; wherein a plurality of third through-holes are provided in the depressors corresponding to the second through-holes so that the fastening means pass therethrough for affixing the depressors on the ZIF connectors.

2. A probe card with ZIF connectors, comprising:
   a substrate means, having a first surface, a second surface, a plurality of concave sections disposed on the second surface and a plurality of first through-holes perpendicular to said first surface and said concave sections, said plurality of first through-holes being circularly arranged toward a center of said substrate means;
   a plurality of ZIF connectors being circularly arranged on said first surface of said substrate means toward said center of said substrate means, each of said plurality of ZIF connectors having parallelly arranged second through-holes from the top to the bottom of said ZIF connectors and pairs of electric terminals being deposed on the bottom of each ZIF connector for contacting first electric contacts of said substrate means; and
   a plurality of detachably adjustable fastening means being disposed through said first through-holes and said second through-holes for assembling and disassembling said ZIF connectors on said first surface of said substrate means, said plurality of detachably adjustable fastening means comprise bolts and fasten plates with holes for fastening thereon; and
   a plurality of depressors deposed on the top surface of the ZIF connectors; wherein a plurality of third through-holes are provided in the depressors corresponding to the second through-holes so that the fastening means pass therethrough for affixing the depressors on the ZIF connectors.

3. The probe card with ZIF connectors of claim 1, further comprising a plurality of depressors deposed on the concave sections of the second surface of the substrate means, wherein the third through-holes are provided in the depressors corresponding to the second through-holes so that the fastening means pass therethrough for affixing the depressors on the ZIF connectors.

4. The probe card with ZIF connectors of claim 1, wherein said plurality of detachably fastening means further comprise sealing gel or resin.

5. The probe card with ZIF connectors of claim 2, further comprising a plurality of depressors deposed on the concave sections of the second surface of the substrate means, wherein the third through-holes are provided in the depressors corresponding to the second through-holes so that the fastening means pass therethrough for affixing the depressors on the ZIF connectors.

6. The probe card with ZIF connectors of claim 2, wherein said plurality of detachably fastening means further comprise sealing gel or resin.

\* \* \* \* \*